United States Patent
Ichida

(10) Patent No.: US 8,797,074 B2
(45) Date of Patent: Aug. 5, 2014

(54) SEMICONDUCTOR DEVICE HAVING DLL CIRCUIT AND CONTROL METHOD THEREOF

(75) Inventor: Hideyuki Ichida, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 14 days.

(21) Appl. No.: 13/538,429

(22) Filed: Jun. 29, 2012

(65) Prior Publication Data

US 2013/0009683 A1   Jan. 10, 2013

(30) Foreign Application Priority Data

Jul. 7, 2011  (JP) .................................. 2011-150859

(51) Int. Cl.
*H03L 7/06*  (2006.01)
(52) U.S. Cl.
USPC .......................................... 327/158; 327/149
(58) Field of Classification Search
None
See application file for complete search history.

(56) References Cited

U.S. PATENT DOCUMENTS 7,936,196 B2 * 5/2011 Kim et al. ...................... 327/158
2010/0142660 A1 * 6/2010 Schnarr .......................... 375/344

FOREIGN PATENT DOCUMENTS

JP        2005-192164 A      7/2005

* cited by examiner

*Primary Examiner* — Cassandra Cox
(74) *Attorney, Agent, or Firm* — Foley & Lardner LLP

(57) ABSTRACT

Disclosed herein is a device that comprises a delay line delaying a first clock signal in response to the delay control information to produce a delayed clock signal, a phase detector unit controls the delay control information in response to a relationship in phase between the first clock signal and a second clock signal, and an inverting control unit receiving the delayed clock signal and producing a third clock signal, the second clock signal being produced in response to the third clock signal. The third clock signal is in phase with the delayed clock signal when the inverting control unit is in a first state and complementary to the delayed clock signal when the inverting control unit is in a second state.

16 Claims, 12 Drawing Sheets

SEMICONDUCTOR DEVICE HAVING DLL CIRCUIT AND CONTROL METHOD THEREOF

This application claims priority to Japanese patent application no. 2011-150859, filed Jul. 7, 2011, the entire contents of which is incorporated herein by reference.

BACKGROUND OF THE INVENTION

1. Field of the Invention

The present invention relates to a semiconductor device and a control method thereof, and more particularly relates to a semiconductor device including a DLL circuit and a control method of the semiconductor device.

2. Description of Related Art

In a semiconductor device that operates in synchronism with a clock signal such as a synchronous DRAM (Dynamic Random Access Memory), an internal clock signal that is phase-controlled is required in some cases. In general, such an internal clock signal is generated by a DLL (Delay Locked Loop) circuit (see Japanese Patent Application Laid-open No. 2005-192164). The DLL circuit includes a delay line that delays an internal clock signal and its amount of delay is controlled by a count value of a counter circuit.

In a general DLL circuit, the count value is counted up or counted down so that a rising edge of a replica clock signal serving as a target of control matches a rising edge of an input clock signal serving as a reference. Accordingly, when the rising edge of the replica clock signal appears during the low level of the input clock signal to represent that the phase of the replica clock signal advances with respect to the phase of the input clock signal, the amount of delay of the delay line is increased. On the other hand, when the rising edge of the replica clock signal appears during the high level of the input clock signal to represent that the phase of the replica clock signal delays with respect to the phase of the input clock signal, the amount of delay of the delay line is decreased.

However, the general DLL circuit explained above is required to have an adjustable range in which a counter circuit can be controlled being more than a 1 clock cycle. The circuit size of the delay line is thus increased.

SUMMARY

In one embodiment, a device is provided that comprises a delay line delaying a first clock signal in response to the delay control information to produce a delayed clock signal, a phase detector unit controls the delay control information in response to a relationship in phase between the first clock signal and a second clock signal, and an inverting control unit receiving the delayed clock signal and producing a third clock signal, the second clock signal being produced in response to the third clock signal. The third clock signal is in phase with the delayed clock signal when the inverting control unit is in a first state and complementary to the delayed clock signal when the inverting control unit is in a second state.

In another embodiment, there is provided a semiconductor device that includes: a counter unit generating a count value; a delay line delaying a first clock signal based on the count value to generate a second clock signal; an inversion control unit selecting one of a non-inverted signal of the second clock signal and an inverted signal of the second clock signal to output a third clock signal; a replica output unit generating a fourth clock signal based on the third clock signal; a phase comparison unit comparing phases of the first and fourth clock signals to generate a phase determination signal; and a control unit generating a reset signal, an inversion control signal, a code update signal, and a counter update signal. The count value of the counter unit is initialized to a first initial value and the inversion control unit selects the non-inverted signal when the reset signal is activated, the inversion control unit selects one of the non-inverted signal and the inverted signal based on a logic level of the phase determination signal when the inversion control signal is activated, the count value of the counter unit is updated from the first initial value to a second initial value when the code update signal is activated after the inversion control signal is activated, and the count value of the counter unit is counted up or counted down from the second initial value based on a logic level of the phase determination signal when the counter update signal is activated.

In still another embodiment, there is provided a method that includes: delaying a first clock signal to produce a delayed clock signal; producing an inverted signal of the delayed clock signal; detecting a relationship in phase between the first clock signal and a second clock signal to produce a detection signal; selecting one of the delayed signal and the inverted signal in response to the detection signal; and producing the second clock signal in response to a selected one of the delayed signal and the inverted signal.

DETAILED DESCRIPTION OF THE EMBODIMENTS

Figure 1:
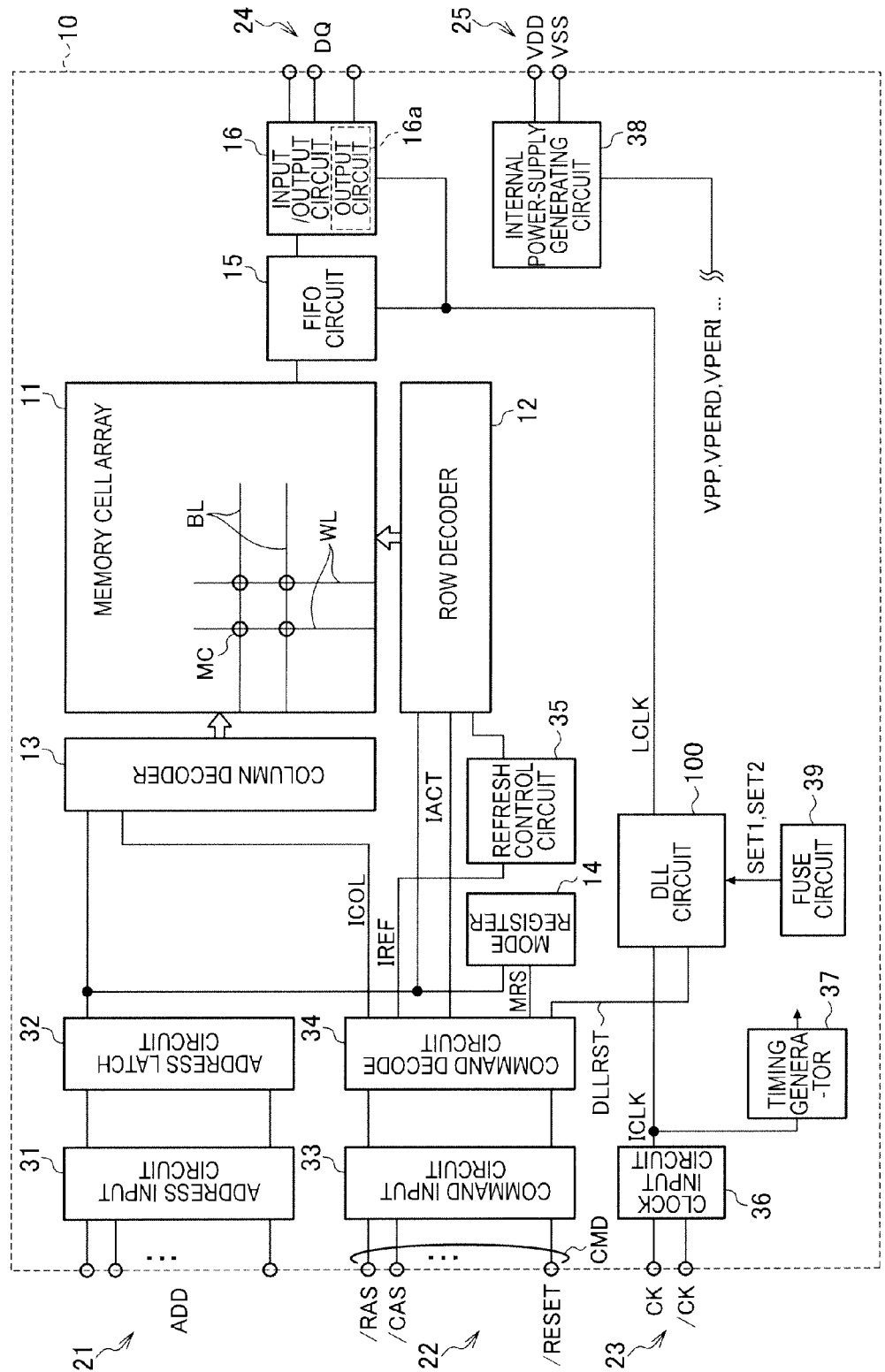
FIG. 1 is a block diagram indicative of an embodiment of an overall configuration of a semiconductor device 10 according to an embodiment of the present invention.

Referring now to FIG. 1, the semiconductor device 10 according to the present embodiment is a DRAM including a memory cell array 11. The memory cell array 11 includes a plurality of word lines WL, a plurality of bit lines BL, and a plurality of memory cells MC arranged at their intersections. The selection of the word line WL is performed by a row decoder 12 and the selection of the bit line BL is performed by a column decoder 13.

As shown in FIG. 1, the semiconductor device 10 includes, as external terminals thereof, an address terminal 21, a command terminal 22, a clock terminal 23, a data terminal 24, and a power supply terminal 25.

The address terminal 21 is a terminal to which an address signal ADD is supplied from outside. The address signal ADD input to the address terminal 21 is supplied via an address input circuit 31 to an address latch circuit 32 that latches the address signal ADD. The address signal ADD latched in the address latch circuit 32 is supplied to the row decoder 12, the column decoder 13, or a mode register 14. The mode register 14 is a circuit in which parameters indicating an operation mode of the semiconductor device 10 are set.

The command terminal 22 is a terminal to which a command signal CMD is supplied from outside. The command signal CMD is constituted by a plurality of signals such as a row-address strobe signal /RAS, a column-address strobe signal /CAS, and a reset signal /RESET. The slash "/" attached to the head of a signal name indicates an inverted signal of a corresponding signal or indicates that the corresponding signal is a low-active signal. The command signal CMD input to the command terminal 22 is supplied via a command input circuit 33 to a command decode circuit 34. The command decode circuit 34 decodes the command signal CMD to generate various internal commands. As these internal commands, an active signal IACT, a column signal ICOL, a refresh signal IREF, a mode register set signal MRS, and a DLL reset signal DLLRST are provided.

The active signal IACT is activated when the command signal CMD indicates a row access (an active command). When the active signal IACT is activated, the address signal ADD latched in the address latch circuit 32 is supplied to the row decoder 12. The word line WL designated by this address signal ADD is selected accordingly.

The column signal ICOL is activated when the command signal CMD indicates a column access (a read command or a write command). When the column signal ICOL is activated, the address signal ADD latched in the address latch circuit 32 is supplied to the column decoder 13. In this manner, the bit line BL designated by this address signal ADD is selected.

Accordingly, when the active command and the read command are supplied in this order and a row address and a column address are supplied in synchronism with these commands, read data is read from a memory cell MC designated by these row address and column address. Read data DQ is output to outside from the data terminal 24 via an FIFO circuit 15 and an input/output circuit 16. Meanwhile, when the active command and the write command are supplied in this order, a row address and a column address are supplied in synchronism with these commands, and then write data DQ is supplied to the data terminal 24, the write data DQ is supplied via the input/output circuit 16 and the FIFO circuit 15 to the memory cell array 11 and written in the memory cell MC designated by these row address and column address. The FIFO circuit 15 and the input/output circuit 16 are operated in synchronism with an internal clock signal LCLK. The internal clock signal LCLK is generated by a DLL circuit 100 to be explained later. Particularly, the input/output circuit 16 includes an output circuit 16a that outputs the read data DQ and the read data DQ is output in synchronism with the internal clock signal LCLK.

The refresh signal IREF is activated when the command signal CMD indicates a refresh command. When the refresh signal IREF is activated, a row access is made by a refresh control circuit 35 and a predetermined word line WL is selected. In this manner, a plurality of memory cells MC connected to the selected word line WL are refreshed. The selection of the word line WL is made by a refresh counter (not shown) included in the refresh control circuit 35.

The mode register set signal MRS is activated when the command signal CMD indicates a mode register set command. Accordingly, when the mode register set command is supplied and a mode signal is supplied from the address terminal 21 in synchronism with this command, a set value of the mode register 14 can be rewritten.

A pair of clock terminals 23 is supplied with external clock signals CK and /CK from outside, respectively. These external clock signals CK and /CK are complementary to each other and then transferred to a clock input circuit 36. The clock input circuit 36 generates an internal clock signal ICLK based on the external clock signals CK and /CK. The internal clock signal ICLK is a basic clock signal within the semiconductor device 10 and sometimes called "first clock signal" in this disclosure. The internal clock signal ICLK is supplied to a timing generator 37 and thus various internal clock signals are generated. The various internal clock signals generated by the timing generator 37 are supplied to circuit blocks such as the address latch circuit 32 and the command decode circuit 34 and define operation timings of these circuit blocks.

The internal clock signal ICLK is also supplied to the DLL circuit 100. The DLL circuit 100 generates the internal clock signal LCLK based on the internal clock signal ICLK. The internal clock signal LCLK is a clock signal that is phase-controlled and sometimes called "third clock signal" in this disclosure. As explained above, the internal clock signal LCLK is supplied to the FIFO circuit 15 and the input/output circuit 16. In this manner, the read data DQ is output in synchronism with the internal clock signal LCLK.

The DLL circuit 100 is reset by the DLL reset signal DLLRST output from the command decode circuit 34. The DLL reset signal DLLRST is activated in response to the reset signal /RESET or a DLL reset command (DLLRST). The reset signal /RESET is activated when a power supply is switched on. The DLL reset command is issued when the DLL circuit 100 needs to be reset. Accordingly, for example, immediately after a power supply is switched on, the DLL circuit 100 is reset by the DLL reset signal DLLRST.

The power supply terminal 25 is a terminal to which the power supply potentials VDD and VSS are supplied. The power-supply potentials VDD and VSS supplied to the power supply terminal 25 are supplied to an internal-power-supply generating circuit 38. The internal-power-supply generating circuit 38 generates various internal potentials VPP, VPERD, and VPERI based on the power supply potentials VDD and VSS. The internal potential VPP is mainly used in the row decoder 12, the internal potential VPERD is mainly used in the DLL circuit 100, and the internal potential VPERI is used in many other circuit blocks.

Figure 2:
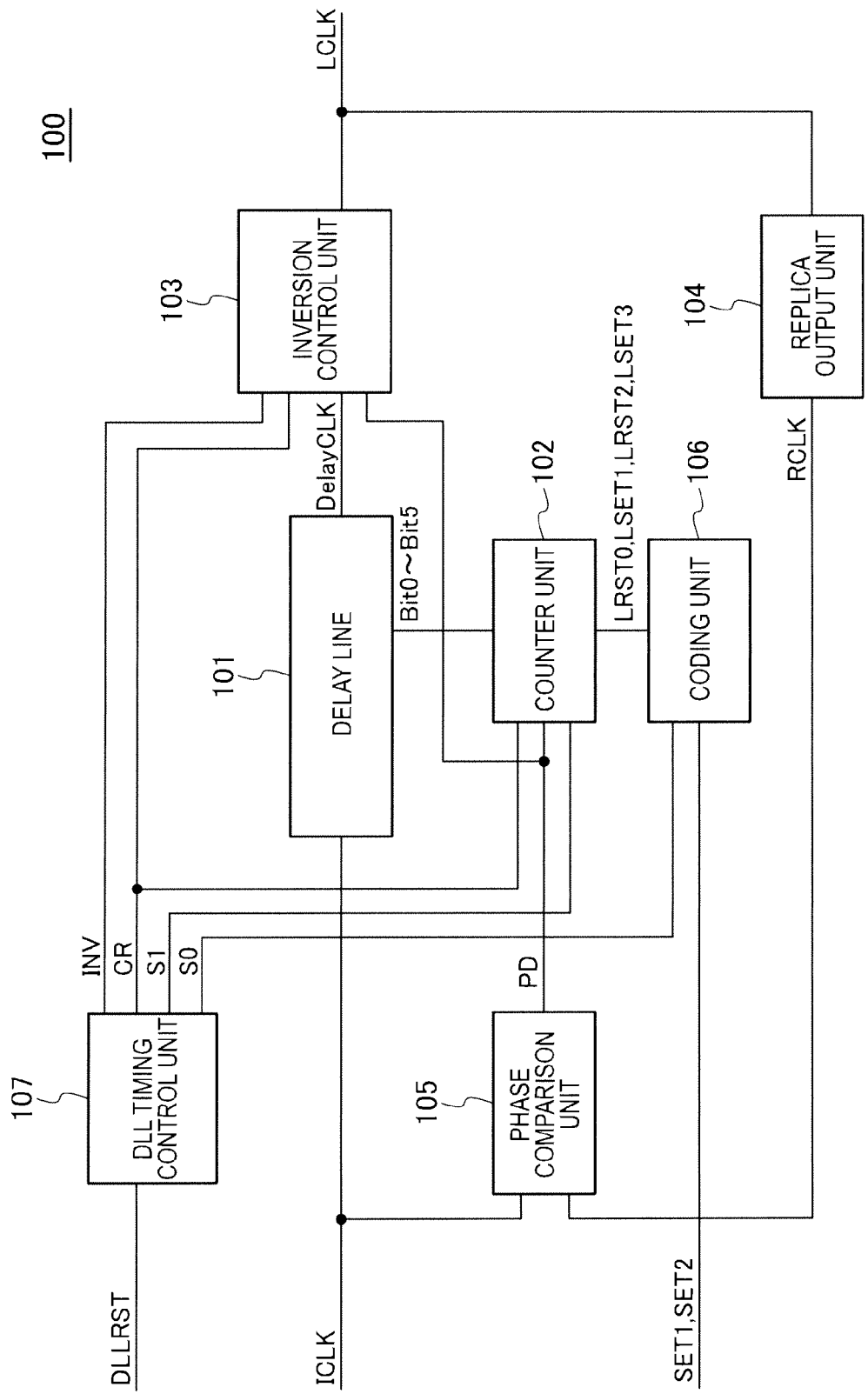
FIG. 2 is a block diagram indicative of an embodiment of a configuration of the DLL circuit 100.

Turning to FIG. 2, the DLL circuit 100 includes a delay line 101 that delays the internal clock signal ICLK to generate an internal clock signal DelayCLK. The delay line 101 applies a delay according to count values Bit0 to Bit5 of a counter unit 102 to the internal clock signal ICLK to generate the internal clock signal DelayCLK.

The internal clock signal DelayCLK is supplied to an inversion control unit 103. The inversion control unit 103 controls whether the internal clock signal DelayCLK is inverted and, as explained later, outputs the internal clock signal DelayCLK with or without being inverted based on a phase determination signal PD, an inversion control signal INV, and a counter reset signal CR. In this disclosure, the internal clock signal DelayCLK is sometimes called "second clock signal".

The internal clock signal LCLK output from the inversion control unit 103 is supplied to the FIFO circuit 15 and the input/output circuit 16 shown in FIG. 1 and also to a replica output unit 104. The replica output unit 104 generates an internal clock signal RCLK serving as a replica (or feedback) signal based on the internal clock signal LCLK and has the same characteristics as those of the output circuit 16a included in the input/output circuit 16. As explained above, the output circuit 16a outputs the read data DQ in synchronism with the internal clock signal LCLK, and therefore the internal clock signal RCLK output from the replica output unit 104 is in synchronism with the read data DQ precisely. In a DRAM, the read data DQ needs to be in synchronism with the external clock signals CK and /CK precisely. When a shift is generated between a phase of the read data and a phase of the external clock signals, this shift needs to be detected and corrected. This detection is performed by a phase comparison unit 105 and a result of detection is fed back to the counter unit 102, so that the phase shift is corrected.

The phase comparison unit 105 compares a phase of the internal clock signal ICLK to a phase of the internal clock signal RCLK and generates the phase determination signal PD based on a result of comparison. The timing of the internal clock signal ICLK matches that of the external clock signals CK and /CK, and the timing of the internal clock signal RCLK matches that of the read data DQ. Therefore, the phase comparison unit 105 indirectly compares the phase of the external clock signals CK and /CK to the phase of the read data DQ. As a result of comparison, when the internal clock signal RCLK delays with respect to the internal clock signal ICLK, the counter unit 102 is counted down by using the phase determination signal PD, so that the amount of delay of the delay line 101 is reduced. On the contrary, when the internal clock signal RCLK advances with respect to the internal clock signal ICLK, the counter unit 102 is counted up by using the phase determination signal PD, so that the amount of delay of the delay line 101 is increased. By periodically repeating these operations, the phase of the internal clock signal ICLK is made to match the phase of the internal clock signal RCLK. Consequently, the phase of the read data DQ matches the phase of the external clock signals CK and /CK. In this disclosure, the internal clock signal RCLK serving as a replica is sometimes called "fourth clock signal" (or "second clock signal").

The count values Bit0 to Bit5 of the counter unit 102 are reset by the counter reset signal CR and initialization signals LRST0, LSET1, LRST2, and LSET3 output from a coding unit 106. Although explained in detail later, a count value reset by the counter reset signal CR is different from a count value reset by the initialization signals LRST0, LSET1, LRST2, and LSET3. In this disclosure, the count value reset by the counter reset signal CR is sometimes called "first initial value" and the count value reset by the initialization signals LRST0, LSET1, LRST2, and LSET3 is sometimes called "second initial value".

The coding unit 106 activates the initialization signals LRST0, LSET1, LRST2, and LSET3 to a predetermined logic level in response to activation of a code update signal S0. When the code update signal S0 is activated, what logic level is specified for the initialization signals LRST0, LSET1, LRST2, and LSET3 is designated by setting signals SET1 and SET2. Accordingly, the second initial value explained above is variable depending on the setting signals SET1 and SET2. The setting signals SET1 and SET2 are output from a fuse circuit 39 shown in FIG. 1. The fuse circuit 39 is a non-volatile storage circuit that stores the setting signals SET1 and SET2 in a non-volatile manner and programmed during manufacturing. In the present invention, it is not essential that the second initial value explained above is variable, and the second initial value can be a fixed value. In this case, the fuse circuit 39 is not required. Furthermore, it is not essential that the fuse circuit 39 is used even when the second initial value is variable, and the setting signals SET1 and SET2 can be stored by using other non-volatile storage circuits.

The DLL circuit 100 further includes a DLL timing control Unit 107. The DLL timing control unit 107 generates the inversion control signal INV, the counter reset signal CR, the code update signal S0, and a counter update signal S1. The order of activation of these signals is specified in advance. When the DLL reset signal DLLRST is activated, the counter reset signal CR, the inversion control signal INV, the code update signal S0, and the counter update signal S1 are activated in this order. The counter update signal S1 is periodically activated thereafter.

Specific circuit configurations of the respective circuit blocks that constitute the DLL circuit 100 are explained next.

Figure 3:
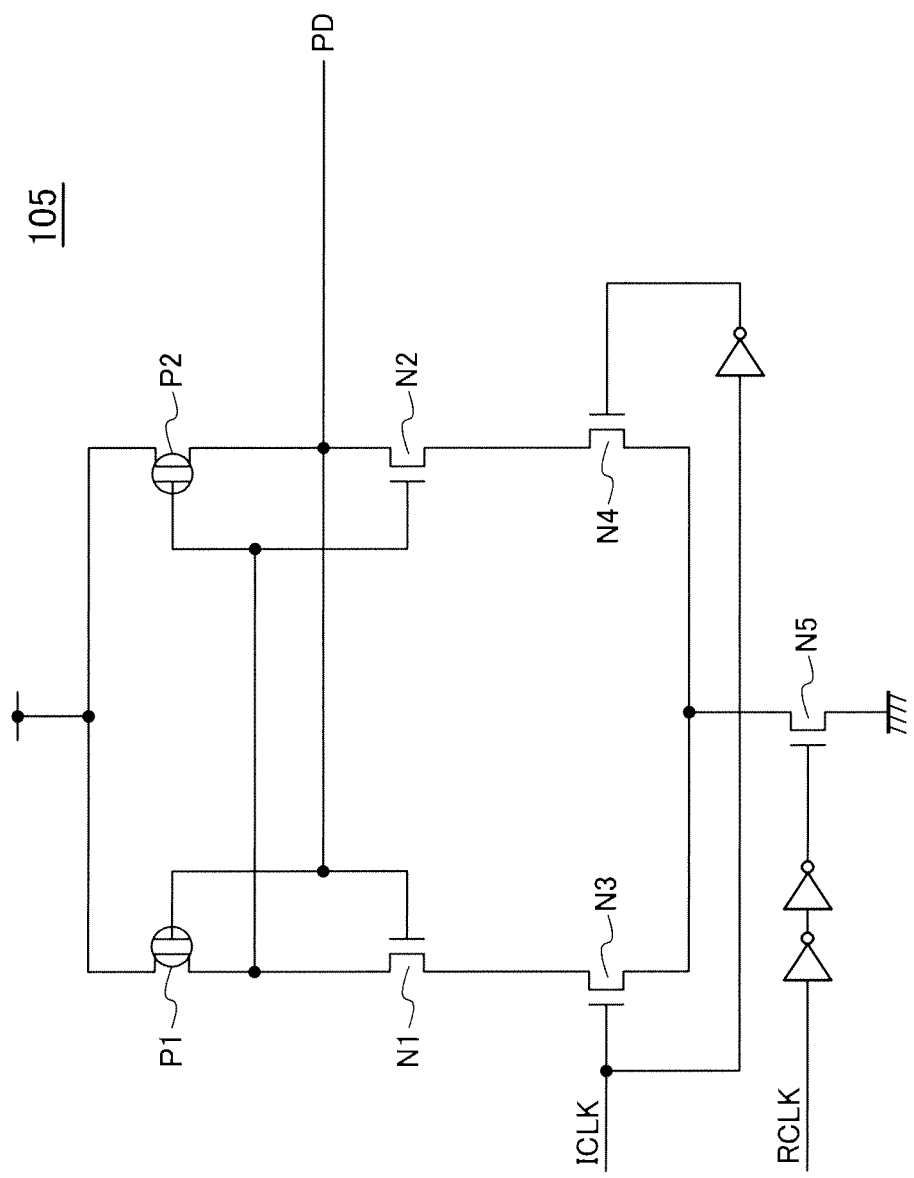
FIG. 3 is a circuit diagram indicative of an embodiment of the phase comparison unit 105.

Turning to FIG. 3, the phase comparison unit 105 is configured so that a P-channel MOS transistor P1 and an N-channel MOS transistor N1 are cross-coupled to a P-channel MOS transistor P2 and an N-channel MOS transistor N2. An N-channel MOS transistor N3 that is switched on during a time period that the internal clock signal ICLK is a high level is connected to a source of the transistor N1. An N-channel MOS transistor N4 that is switched on during a time period that the internal clock signal ICLK is a low level is connected to a source of the transistor N2. An N-channel MOS transistor N5 that is switched on during a time period that the internal clock signal RCLK is a high level is connected to sources of the transistors N3 and N4.

With this configuration, when the phase of the internal clock signal RCLK delays with respect to the phase of the internal clock signal ICLK, the transistor N3 is switched on before the transistor N4 during a time period that the transistor N5 is switched on, and thus the phase determination signal PD becomes a high level. On the other hand, when the phase of the internal clock signal RCLK advances with respect to the phase of the internal clock signal ICLK, the transistor N4 is switched on before the transistor N3 during the time period that the transistor N5 is switched on, and thus the phase determination signal PD becomes a low level.

In this manner, the phase comparison unit 105 can compare the phase of the internal clock signal RCLK to the phase of the internal clock signal ICLK for every clock cycle and output a result of comparison as the phase determination signal PD. As shown in FIG. 2, the phase determination signal PD is supplied to the counter unit 102 and the inversion control unit 103.

Figure 4:
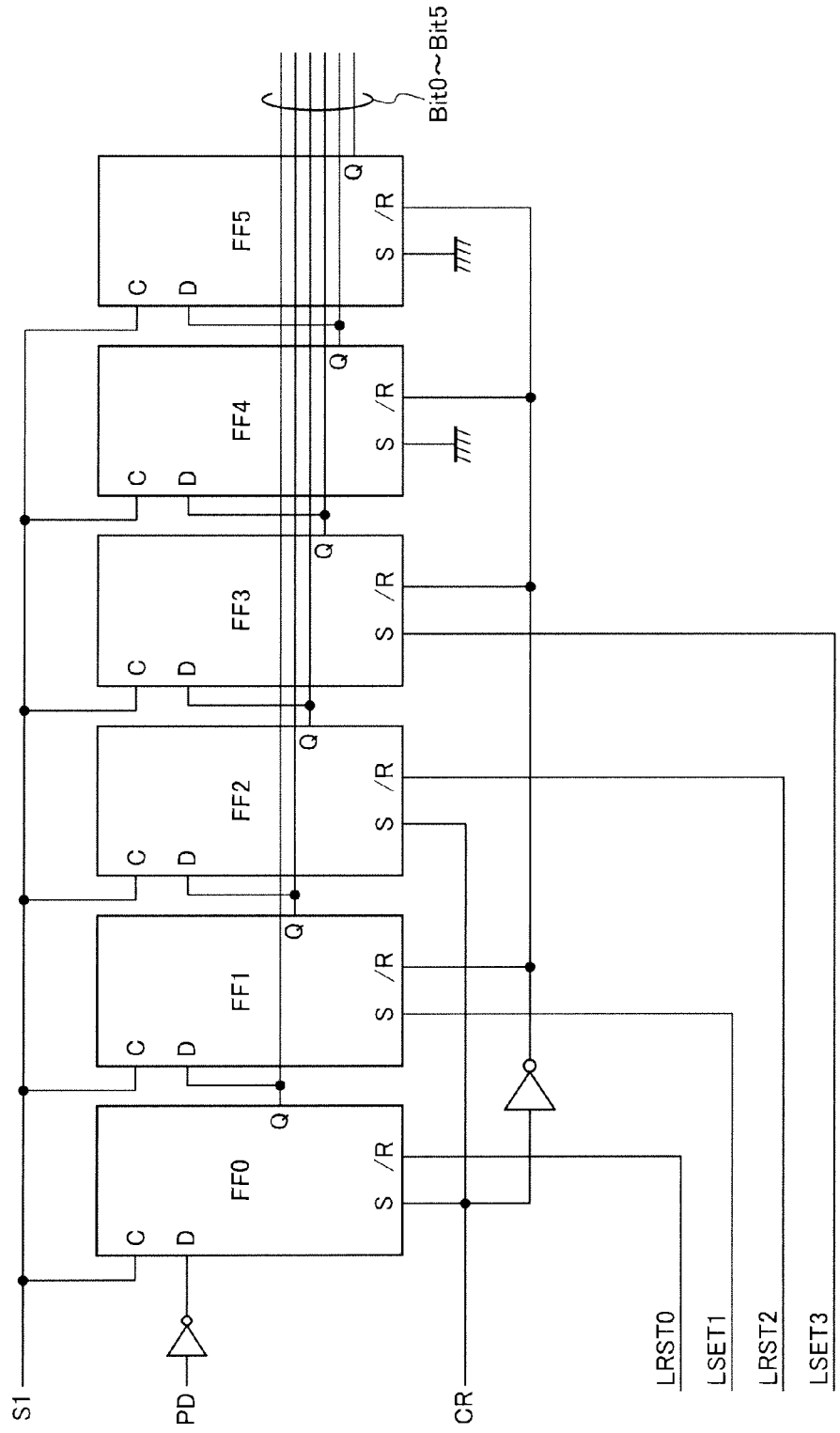
FIG. 4 is a circuit diagram indicative of an embodiment of the counter unit 102.

Turning to FIG. 4, the counter unit 102 includes six flip-flop circuits FF0 to FF5 cascade-connected to each other. That is, the count value of the counter unit 102 is represented by 6-bit in the present embodiment. The minimum value of the count value is "000000" that is a decimal number 0. The maximum value of the count value is "111111" that is a decimal number 63. Accordingly, the counter unit 102 according to the present embodiment can output 64-step count values. In the present invention, the bit number of the counter unit 102 is not limited thereto.

Each of the flip-flop circuits FF0 to FF5 includes an input node D, an output node Q, a clock node C, a set node S, and a reset node /R. The function of these flip-flop circuits FF0 to FF5 is the same as that of a general flip-flop circuit. In response to a rising edge of a signal supplied to the clock node C, a signal supplied to the input node D is latched and a latched signal is output from the output node Q. When a signal supplied to the set node S is activated to a high level, a signal output from the output node Q is forcibly made to be a high level. When a signal supplied to the reset node /R is activated to a low level, the signal output from the output node Q is forcibly made to be a low level.

As shown in FIG. 4, the flip-flop circuits FF0 to FF5 are cascade-connected to each other in this order. The output node Q of a flip-flop circuit FFi (i=0 to 4) at a preceding stage is connected to the input node D of a flip-flop circuit FFi+1 at a subsequent stage. An inverted phase-determination signal PD is supplied to the input node D of the flip-flop circuit FF0 at an initial stage. The counter update signal S1 is supplied to the clock nodes C of the flip-flop circuits FF0 to FF5. Signals Bit0 to Bit5 output from the output nodes Q of the flip-flop circuits FF0 to FF5 are supplied to the delay line 101 as the count value of the counter unit 102. A signal Bit0 is the least significant bit (LSB) of the count value and a signal Bit5 is the most significant bit (MSB) of the count value.

With this configuration, every time the counter update signal S1 is activated, the count values Bit5 to Bit0 are counted up or counted down based on a logic level of the phase determination signal PD. The delay line 101 to which the count values Bit5 to Bit0 are supplied applies a delay according to the corresponding value to the internal clock signal ICLK, so that the internal clock signal DelayCLK is generated. The amount of delay becomes smaller as the count values Bit5 to Bit0 are smaller and becomes larger as the count values Bit5 to Bit0 are larger.

The counter reset signal CR is supplied to the respective flip-flop circuits FF0 to FF5. Specifically, the counter reset signal CR is supplied to the set nodes S of the flip-flop circuits FF0 and FF2. Meanwhile, an inverted signal of the counter reset signal CR is supplied to the reset nodes /R of the remaining flip-flop circuits FF1 and FF3 to FF5. Accordingly, when the counter reset signal CR is activated to a high level, the flip-flop circuits FF0 and FF2 are set and the remaining flip-flop circuits FF1 and FF3 to FF5 are reset. Therefore, the count values Bit5 to Bit0 become "000101". This value is a decimal number 5 and corresponds to the first initial value explained above. In this manner, the first initial value is offset greatly from a central value of the count value and designed to be adjacent to the minimum value. Therefore, while numbers capable of being counted up from the first initial value can be sufficiently ensured, numbers capable of being counted down are less.

Furthermore, the initialization signals LRST0, LSET1, LRST2, and LSET3 are supplied to the flip-flop circuits FF0 to FF3, respectively. Specifically, the initialization signals LRST0 and LRST2 are supplied to the reset nodes /R of the flip-flop circuits FF0 and FF2, respectively. The initialization signals LSET1 and LSET3 are supplied to the set nodes S of the flip-flop circuits FF1 and FF3, respectively. These initialization signals LRST0, LSET1, LRST2, and LSET3 are, as explained above, supplied from the coding unit 106, and their logic levels are designated by the setting signals SET1 and SET2.

Figure 5:
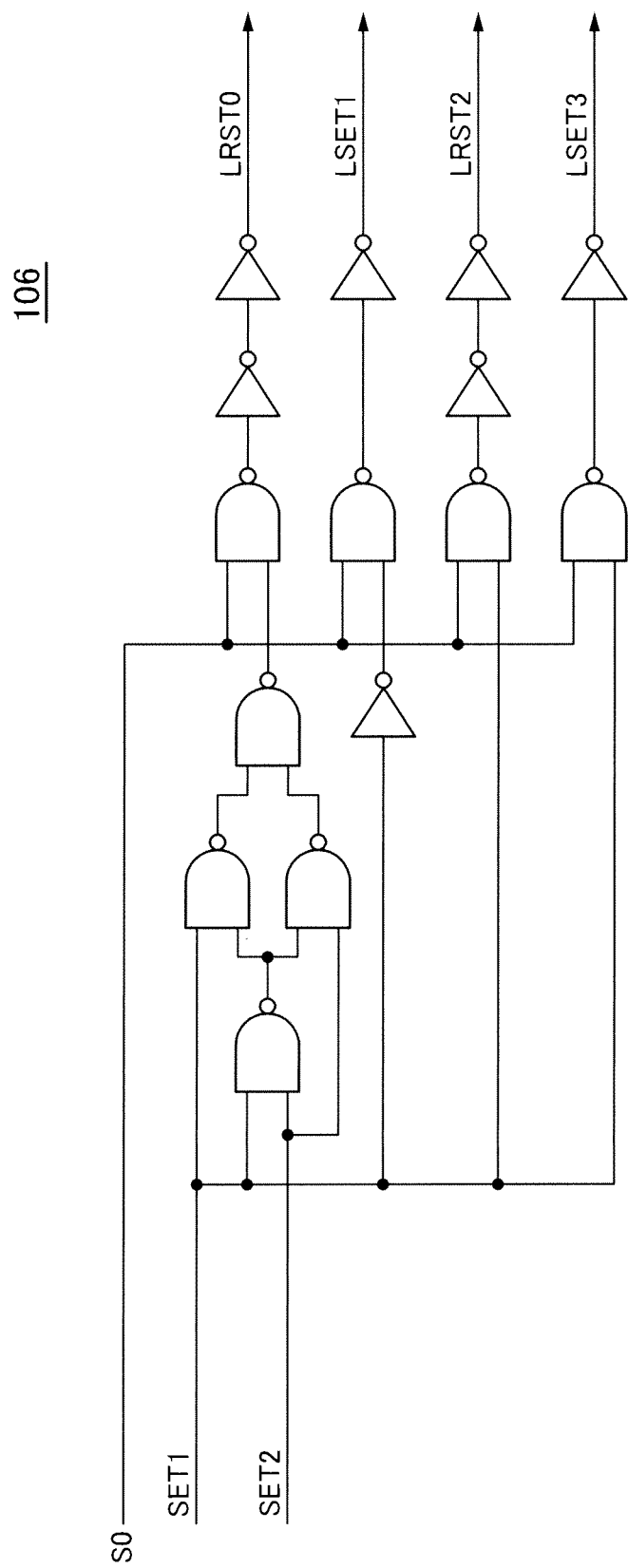
FIG. 5 is a circuit diagram indicative of an embodiment of the coding unit 106.

Turning to FIG. 5, the coding unit 106 is of a type of decoding circuit activated by the code update signal S0 and generates the initialization signals LRST0, LSET1, LRST2, and LSET3 based on a result of decoding the setting signals SET1 and SET2. When the code update signal S0 is a low level, the initialization signals LRST0 and LRST2 are a high level and the initialization signals LSET1 and LSET3 are a low level, so that no influence is exerted on the counter unit 102.

On the other hand, when the code update signal S0 is a high level, one or more of the initialization signals LRST0, LSET1, LRST2, and LSET3 are activated. Specifically, when the code update signal S0 is activated in a case where the setting signal SET1 is a low level and the setting signal SET2 is a high level, the initialization signal LRST0 is activated to a low level and the initialization signal LSET1 is activated to a high level. In this manner, the flip-flop circuit FF0 of the counter unit 102 is reset and the flip-flop circuit FF1 of the counter unit 102 is set, so that the count value jumps from "000101" to "000110". In decimal notation, the count value is counted up from "5" to "6" by one pitch.

When the code update signal S0 is activated in a case where both of the setting signals SET1 and SET2 are a low level, the initialization signal LSET1 is activated to a high level. Accordingly, the flip-flop circuit FF1 of the counter unit 102 is set and thus the count value jumps from "000101" to "000111". In decimal notation, the count value is counted up from "5" to "7" by two pitches.

Furthermore, when the code update signal S0 is activated in a case where the setting signal SET1 is a high level and the setting signal SET2 is a low level, the initialization signals LRST0 and LRST2 are activated to a low level and the initialization signal LSET3 is activated to a high level. The flip-flop circuits FF0 and FF2 of the counter unit 102 are reset and the flip-flop circuit FF3 of the counter unit 102 is set, so that the count value jumps from "000101" to "001000". In decimal notation, the count value is counted up from "5" to "8" by three pitches.

When the code update signal S0 is activated in a case where both of the setting signals SET1 and SET2 are a high level, the initialization signal LRST2 is activated to a low level and the initialization signal LSET3 is activated to a high level. The flip-flop circuit FF2 of the counter unit 102 is reset and the flip-flop circuit FF3 of the counter unit 102 is set, so that the count value jumps from "000101" to "001001". In decimal notation, the count value is counted up from "5" to "9" by four pitches.

As explained above, when the code update signal S0 is activated, the count value of the counter unit 102 is forcibly counted up by one pitch to four pitches. As explained later, how many pitches the count value jumps in response to the code update signal S0 can be selected according to a magnitude of a jitter component included in the internal clock signal ICLK.

Figure 6:
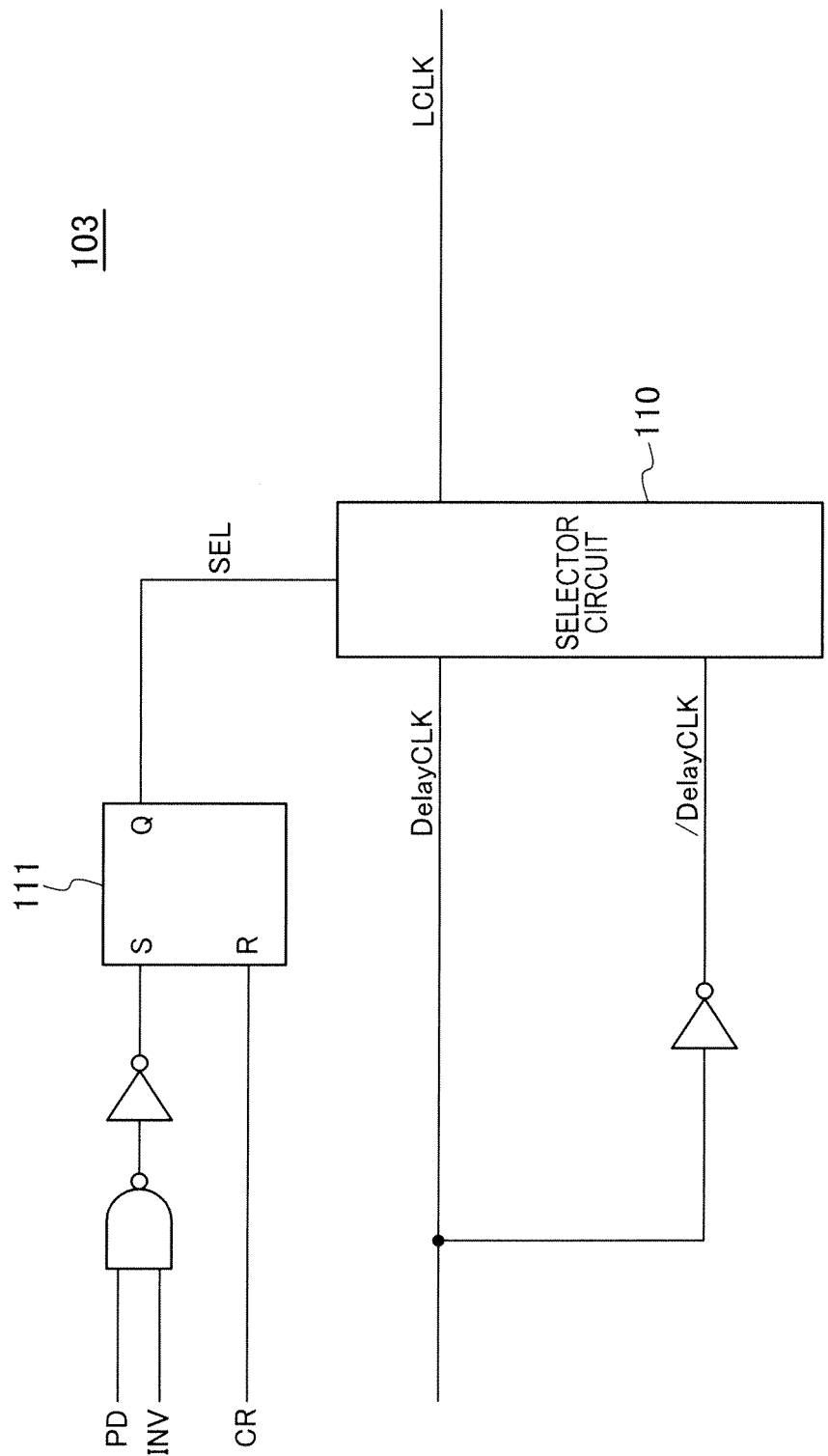
FIG. 6 is a circuit diagram indicative of an embodiment of the inversion control unit 103.

Turning to FIG. 6, the inversion control unit 103 includes a selector circuit 110 that receives the internal clock signal DelayCLK and its inverted signal /DelayCLK and outputs one of them. The selection by the selector circuit 110 is made based on a select signal SEL output from an output node Q of an SR latch circuit 111. The selector circuit 110 selects the non-inverted internal clock signal DelayCLK when the select signal SEL is a low level and the inverted internal clock signal /DelayCLK when the select signal SEL is a high level.

A logical product of the phase determination signal PD and the inversion control signal INV is input to a set node S of the SR latch circuit 111 and the counter reset signal CR is input to a reset node R. With this configuration, in an initial state where the counter reset signal CR is activated, the non-inverted internal clock signal DelayCLK is selected. Thereafter, when the logic level of the phase determination signal PD is a high level at a timing when the inversion control signal INV is activated to a high level, the SR latch circuit 111 is set and the inverted internal clock signal /DelayCLK is selected.

The specific circuit configuration of the DLL circuit 100 is as explained above. An operation of the DLL circuit 100 is explained next.

Figure 7:
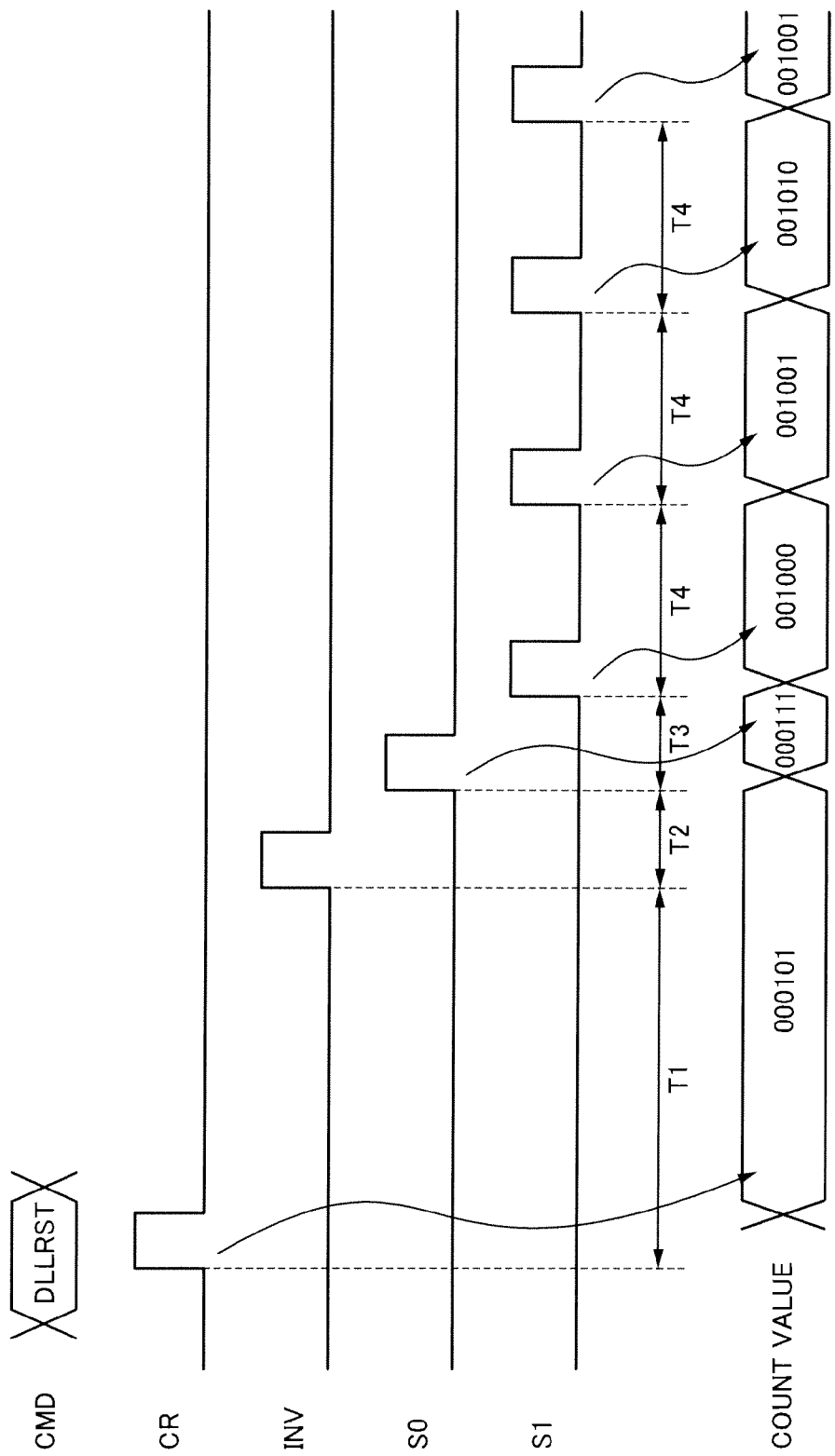
FIG. 7 is a timing diagram for explaining an operation of the DLL circuit 100.

Turning to FIG. 7, when the DLL reset command is issued from outside and thus the DLL reset signal DLLRST is activated, the DLL timing control unit 107 activates the counter reset signal CR, the inversion control signal INV, the code update signal S0, and the counter update signal S1 in this order. While the intervals that these signals are activated can be set arbitrarily, the time required for reflecting properly a change in the count value on the internal clock signal RCLK needs to be ensured. As an example, time periods T1 to T3 shown in FIG. 7 are desirably equal to or longer than a time period T4 that is an activation period of the counter update signal S1.

When the counter reset signal CR is activated first, the count value of the counter unit 102 is reset to "000101" that is the first initial value, that is, a decimal number "5". Accordingly, as the amount of delay of the delay line 101, a delay according to the corresponding count value is applied to the internal clock signal ICLK and this is output as the internal clock signal DelayCLK.

When the time period T1 elapses since the activation of the counter reset signal CR, the inversion control signal INV is activated. When the logic level of the phase determination signal PD is a low level at this timing, the SR latch circuit 111 is not set and thus the non-inverted internal clock signal DelayCLK is selected and this signal is output as the internal clock signal LCLK. On the other hand, when the logic level of the phase determination signal PD is a high level at this timing, the SR latch circuit 111 is set and thus the inverted internal clock signal /DelayCLK is selected and this signal is output as the internal clock signal LCLK. The significance of using the inverted internal clock signal /DelayCLK is explained later.

When the time period T2 elapses since the activation of the inversion control signal INV, the code update signal S0 is activated. In this manner, the count value of the counter unit 102 jumps from the first initial value to the second initial value. Specific values of the second initial value are as already explained above. In an example shown in FIG. 7, the count value is shown as being counted up from "000101" to "000111" by two pitches.

When the time period T3 elapses since the activation of the code update signal S0, the counter update signal S1 is activated. When the counter update signal S1 is activated, as explained with reference to FIG. 4, the count value of the counter unit 102 is counted up or counted down by one pitch based on the logic level of the phase determination signal PD. This is an operation for making the phase of the internal clock signal RCLK more approach the phase of the internal clock signal ICLK. In the example shown in FIG. 7, the count value is shown as being counted up from "000111" to "001000".

Thereafter, the counter update signal S1 is periodically activated for every time period T4 and each time the counter update signal S1 is activated, the count value of the counter unit 102 is counted up or counted down. By repeating such operations, the phase of the internal clock signal RCLK substantially matches that of the internal clock signal ICLK, and after these phases match each other, this state is maintained. That is, the DLL circuit 100 is locked.

Figure 8:
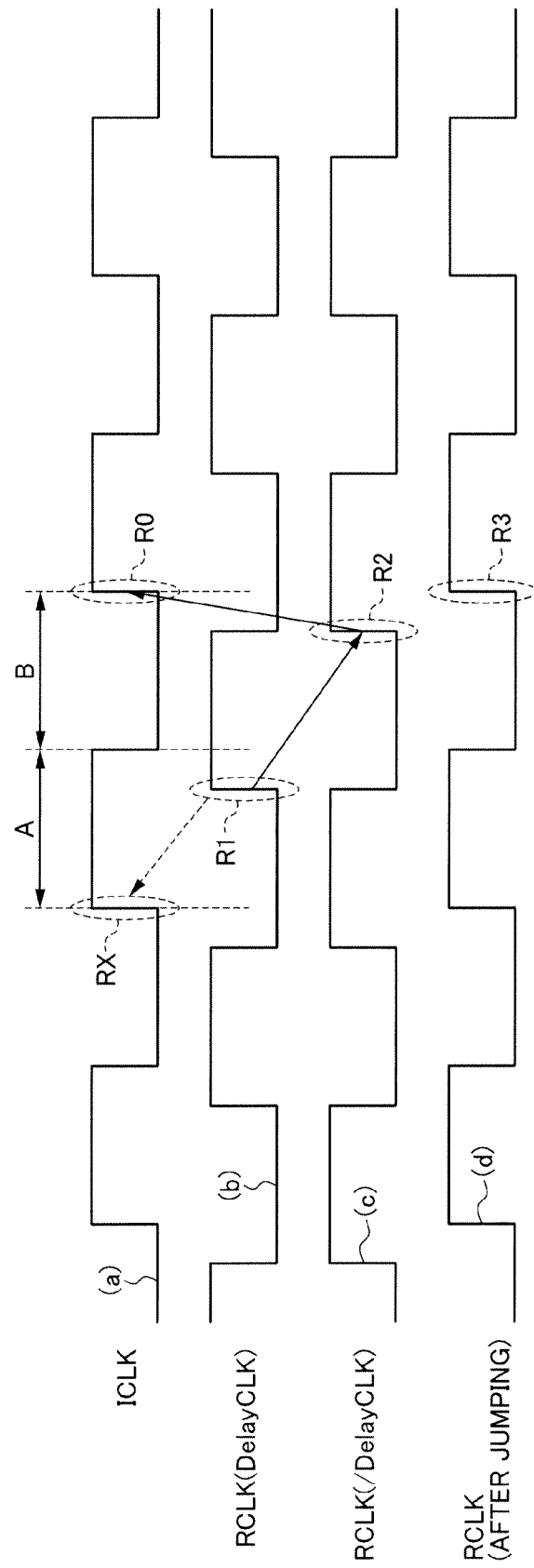
FIG. 8 is a timing diagram for explaining a case where the inverted signal /DelayCLK of an internal clock signal is selected by the inversion control unit 103, and shows a phase when the count value of the counter unit 102 is set to the first initial value.

Turning to FIG. 8, (a) shows a waveform of the internal clock signal ICLK, (b) shows a waveform of the internal clock signal RCLK generated based on the internal clock signal DelayCLK, (c) shows a waveform of the internal clock signal RCLK generated based on the inverted internal clock signal /DelayCLK, and (d) shows a waveform of the internal clock signal RCLK after jumping.

As shown in FIG. 8, when a rising edge R1 of the internal clock signal RCLK shown by (b) appears in a time period A during which the internal clock signal ICLK shown by (a) is a high level, the phase determination signal PD becomes a high level at the activation timing of the inversion control signal INV. Based on this, the inverted internal clock signal /DelayCLK is selected and thus the waveform of the internal clock signal RCLK is inverted into the waveform shown by (c). That is, because a rising edge R2 of the internal clock signal RCLK is moved by ½ period, a phase difference to a target rising edge R0 of the internal clock signal ICLK is reduced.

When the inverted internal clock signal /DelayCLK is not used and the non-inverted internal clock signal DelayCLK is used as the internal clock signal LCLK, as shown by (b), although it is not supposed to, the DLL circuit 100 operates with the preceding rising edge RX as a target edge. That is, when the non-inverted internal clock signal DelayCLK is used, because the phase determination signal PD is a high level, the counter unit 102 needs to advance counting down. To permit this process, the first initial value of the counter unit 102 needs to be set to be adjacent to the central value and countable numbers need to be designed to be about twice countable numbers of the present embodiment. In this case, circuit sizes of the counter unit 102 and the delay line 101 are increased. To prevent this, according to the present embodiment, the first initial value of the counter unit 102 is offset and the countable numbers are designed to be less. Accordingly, the counting down from the first initial value cannot be repeated for many times. However, according to the present embodiment, as shown in FIG. 8, when the rising edge R1 of the internal clock signal RCLK shown by (b) appears in the time period A during which the internal clock signal ICLK shown by (a) is a high level, the inverted internal clock signal /DelayCLK is used as the internal clock signal LCLK. As a result, the above problem is avoided.

Furthermore, when the code update signal S0 is activated, the count value of the counter unit 102 is forcibly counted up by one pitch to four pitches. As shown by (d) of FIG. 8, a rising edge R3 of the internal clock signal RCLK more approaches the target rising edge R0 of the internal clock signal ICLK. By performing counting up for several times (or performing counting down for several times in some cases) thereafter in synchronism with the counter update signal S1, the DLL circuit 100 can be locked.

Figure 9:
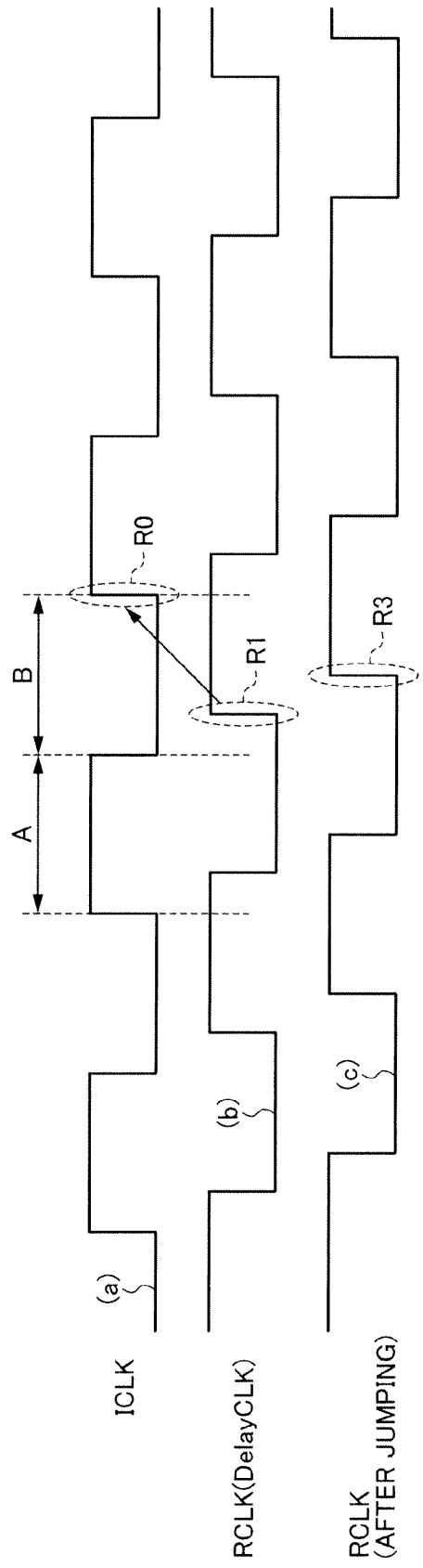
FIG. 9 is a timing diagram for explaining a case where the internal clock signal DelayCLK is selected by the inversion control unit 103, and shows a phase when the count value of the counter unit 102 is set to the first initial value.

Turning to FIG. 9, (a) shows the waveform of the internal clock signal ICLK, (b) shows the waveform of the internal clock signal RCLK generated based on the internal clock signal DelayCLK, and (c) shows the waveform of the internal clock signal RCLK after jumping.

As shown in FIG. 9, when the rising edge R1 of the internal clock signal RCLK shown by (b) appears in a time period B during which the internal clock signal ICLK shown by (a) is a low level, the phase determination signal PD becomes a low level at the activation timing of the inversion control signal INV. Based on this process, the non-inverted internal clock signal DelayCLK is selected. In this manner, the control with the rising edge R0 of the internal clock signal ICLK as a target is performed.

Furthermore, when the code update signal S0 is activated, the count value of the counter unit 102 is forcibly counted up by one pitch to four pitches. As shown in FIG. 9, the rising edge R3 of the internal clock signal RCLK more approaches the target rising edge R0 of the internal clock signal ICLK. Accordingly, by performing counting up for several times (or performing counting down for several times in some cases) thereafter in synchronism with the counter update signal S1, the DLL circuit 100 can be locked.

As explained above, according to the present embodiment, no matter how the phase in the initial state is, the DLL circuit 100 is locked mainly by counting up the counter unit 102. Accordingly, a state where the count value of the counter unit 102 is repeatedly counted down from the first initial value does not need to be assumed, and thus the circuit sizes of the counter unit 102 and the delay line 101 can be designed to be small.

Figure 10:
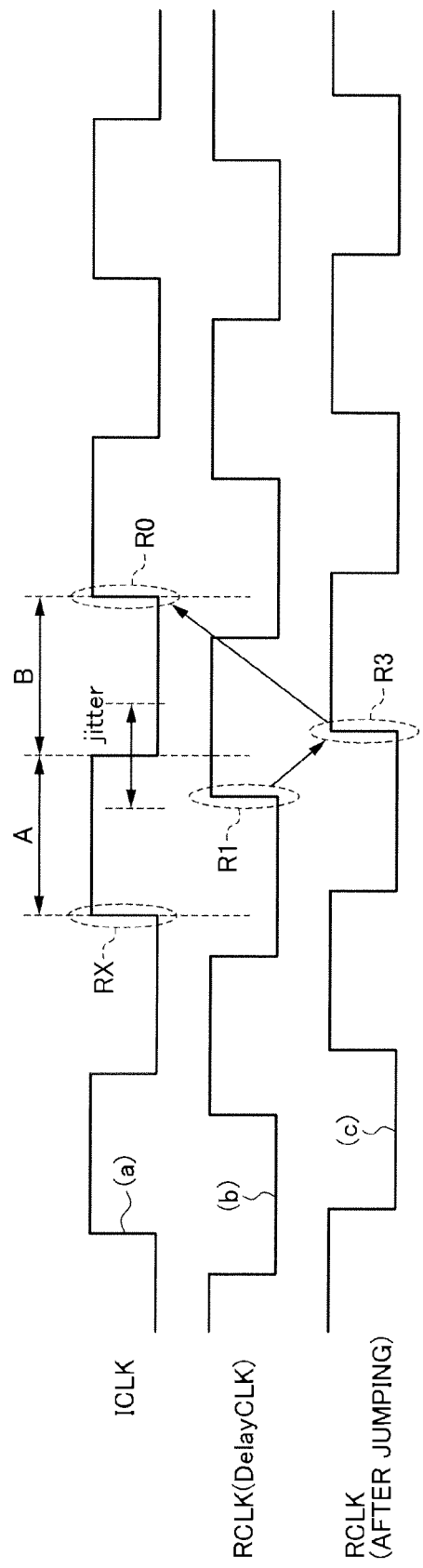
FIG. 10 is a timing diagram for explaining a case where the non-inverted internal clock signal DelayCLK is wrongly selected by an influence of jitter, and corresponds to FIG. 8.

Turning to FIG. 10, (a) shows the waveform of the internal clock signal ICLK, (b) shows the waveform of the internal clock signal RCLK generated based on the internal clock signal DelayCLK, and (c) shows the waveform of the internal clock signal RCLK after jumping.

As shown in FIG. 10, when the rising edge R1 of the internal clock signal RCLK shown by (b) appears in the time period A during which the internal clock signal ICLK shown by (a) is a high level, as explained with reference to FIG. 8, originally, the inverted internal clock signal /DelayCLK is selected. However, when the rising edge R1 of the internal clock signal RCLK accidentally appears in the time period B during which the internal clock signal ICLK is a low level at the activation timing of the inversion control signal INV because of the influence of jitter, the non-inverted internal clock signal DelayCLK is selected. As explained above, when the operation of the inversion control unit 103 fails by the influence of jitter, a phase-controlling operation tends to proceed with the preceding rising edge RX of the internal clock signal ICLK as a target.

However, according to the present embodiment, the inversion control signal INV is activated and then the code update signal S0 is activated. In this manner, the count value of the counter unit 102 is forcibly counted up by one pitch to four pitches. As shown in FIG. 10, the rising edge R3 of the internal clock signal RCLK after jumping shown by (c) is moved to the time period B during which the internal clock signal ICLK is a low level, and thus the counter unit 102 performs counting up with the rising edge R0 of the internal clock signal ICLK as a target. In this manner, it is possible to avoid stacking of the counter unit 102 caused by repeated counting down with the preceding rising edge RX of the internal clock signal ICLK as the target.

Accordingly, it suffices that the amount of jump of the count value in response to the code update signal S0 is selected by considering assumed jitter. That is, it suffices that the setting signals SET1 and SET2 are selected so that the amount of jump is larger than a difference in the count value corresponding to a jitter component included in the internal clock signal ICLK. In practice, while the amount of jump can be one pitch when the assumed jitter is sufficiently small, to reliably eliminate the influence of jitter, the amount of jump is desirably set to be equal to or larger than two pitches.

Figure 11:
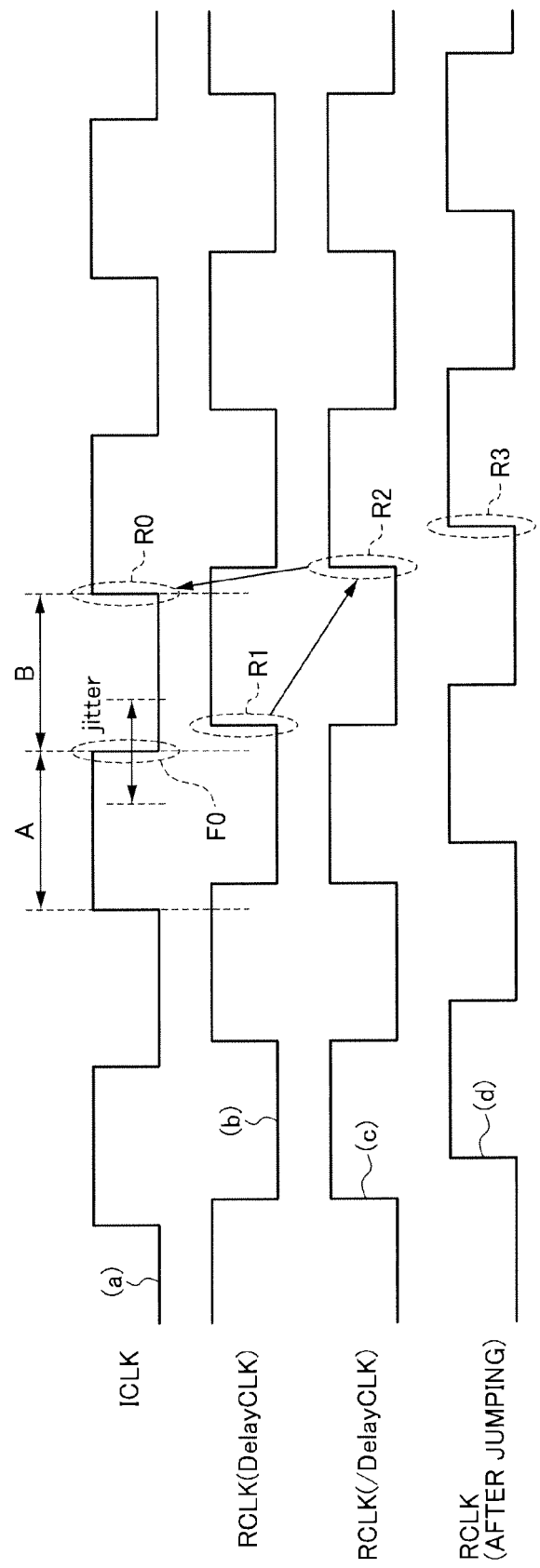
FIG. 11 is a timing diagram for explaining a case where the inverted internal clock signal /DelayCLK is wrongly selected by the influence of jitter, and corresponds to FIG. 9.

Turning to FIG. 11, (a) shows the waveform of the internal clock signal ICLK, (b) shows the waveform of the internal clock signal RCLK generated based on the internal clock signal DelayCLK, (c) shows the waveform of the internal clock signal RCLK generated based on the inverted internal clock signal /DelayCLK, and (d) shows the waveform of the internal clock signal RCLK after jumping.

As shown in FIG. 11, when the rising edge R1 of the internal clock signal RCLK shown by (b) appears in the time period B during which the internal clock signal ICLK shown by (a) is a low level, as explained with reference to FIG. 9, originally, the non-inverted internal clock signal DelayCLK is selected. However, when the rising edge R1 of the internal clock signal RCLK accidentally appears in the time period A during which the internal clock signal ICLK is a high level at the activation timing of the inversion control signal INV because of the influence of jitter, the inverted internal clock signal /DelayCLK is selected. In this manner, the waveform of the internal clock signal RCLK is inverted as shown by (c). Thereafter, the code update signal S0 is activated and the count value of the counter unit 102 is forcibly counted up by one pitch to four pitches as shown by (d).

As a result, while the rising edge R3 of the internal clock signal RCLK after jumping is placed in the time period A during which the internal clock signal ICLK is a high level, a wrong determination caused by the influence of jitter is limited to a case where a falling edge F0 of the internal clock signal ICLK is adjacent to the rising edge R1 of the internal clock signal RCLK. The phase of the rising edge R3 of the internal clock signal RCLK after jumping merely delays a little with respect to the phase of the target rising edge R0 of the internal clock signal ICLK. Accordingly, the DLL circuit 100 can be locked by counting down for several times and thus the counter unit 102 is not stacked.

Figure 12:
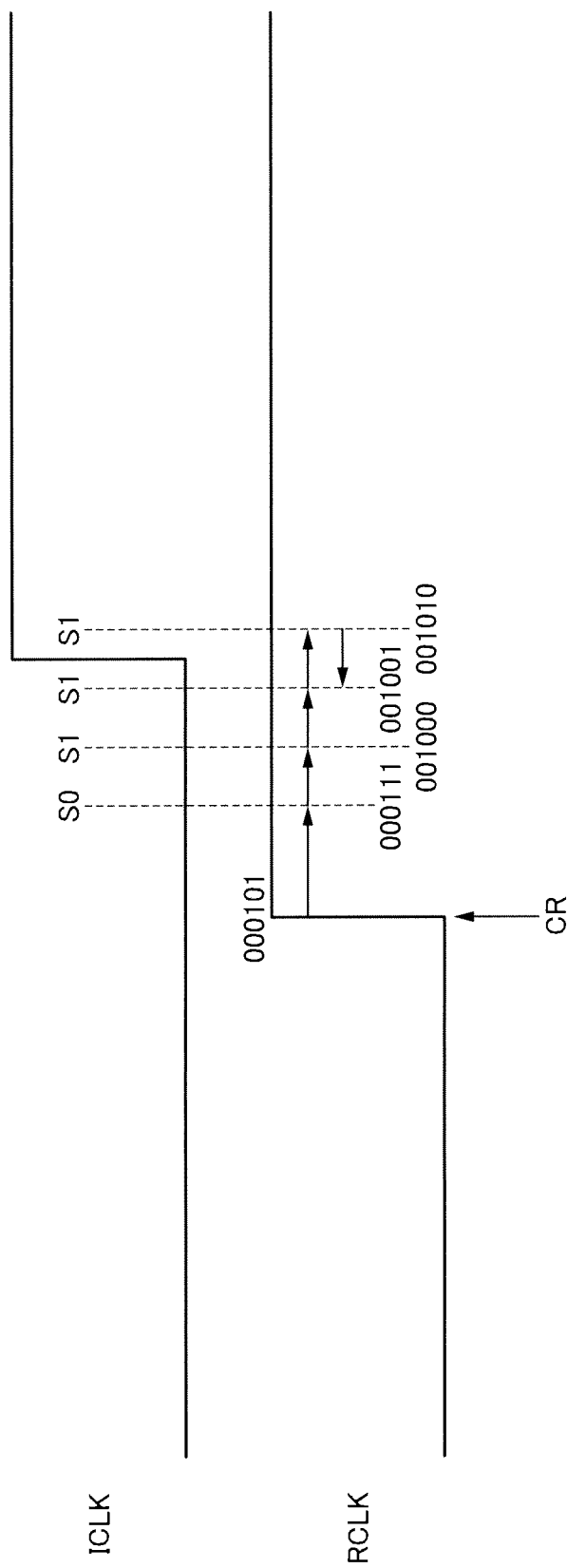
FIG. 12 is a schematic timing diagram for explaining a process where the DLL circuit 100 is locked.

Turning to FIG. 12, when the count value of the counter unit 102 is reset to "000101" serving as the first initial value by the activation of the counter reset signal CR, the phase of the internal clock signal RCLK advances with respect to the phase of the internal clock signal ICLK. Next, the count value of the counter unit 102 jumps from "000101" serving as the first initial value to "000111" servings as the second initial value by two pitches by the activation of the code update signal S0. Thereafter, in response to the periodically activated counter update signal S1, the count value is counted up to "001000", "001001", and "001010", and then counted down to "001001". A state where the count value indicates such a change pattern is a state where the DLL circuit 100 is locked and the internal clock signal RCLK follows the internal clock signal ICLK with their phases substantially matching each other.

As explained above, according to the present embodiment, because the internal clock signal DelayCLK or the inverted internal clock signal /DelayCLK is selected by using the inversion control unit 103, the circuit sizes of the counter unit 102 and the delay line 101 can be reduced as compared to conventional cases. Furthermore, the selection by the inversion control unit 103 is made and then the count value of the counter unit 102 is forcibly counted up. Accordingly, even if the inversion control unit 103 makes wrong selection by the influence of jitter, the counter unit 102 is not stacked and the DLL circuit 100 can be properly locked.

It is apparent that the present invention is not limited to the above embodiments, but may be modified and changed without departing from the scope and spirit of the invention.

For example, in the above embodiment, the first initial value is specified as a value adjacent to the minimum value, selection by the inversion control unit 103 is made, and then the count value of the counter unit 102 is forcibly counted up. On the contrary, it is also possible that the first initial value is specified as a value adjacent to the maximum value, selection by the inversion control unit 103 is made, and then the count value of the counter unit 102 is forcibly counted down.

What is claimed is:
1. A device comprising:
 a delay line unit supplied with delay control information, the delay line configured to delay a first clock signal in response to the delay control information to produce a delayed clock signal;
 a phase detector unit supplied with the first clock signal and a second clock signal and configured to control the delay control information in response to a relationship in phase between the first and second clock signals; and a circuit unit coupled between the delay line unit and the phase detector unit, the circuit unit including an inverting control unit configured to receive the delayed clock signal and to produce a third clock signal, the third clock signal being in phase with the delayed clock signal when the inverting control unit is in a first state and complementary to the delayed clock signal when the inverting control unit is in a second state, the circuit unit being configured to produce the second clock signal as a replica signal in response to the third clock signal.

2. The device as claimed in claim 1, wherein the inverting control unit is in the first state when one of leading and trailing edges of the second clock signal appears during a first logic level of the first clock signal and in the second state when the one of leading and trailing edges of the second clock signal appears during a second logic level of the first clock signal.

3. The device as claimed in claim 1, wherein the inverting control unit is supplied with an output of the phase detector unit to take one of the first and second state.

4. The device as claimed in claim 1, further comprising a counter unit, a count value of the counter unit serving as the delay control information and being controlled by an output of the phase detector unit.

5. The device as claimed in claim 4, wherein the counter unit is configured to take an initial value in response to an initial state so that the delay control information is changed from the initial value in response to the output of the phase detector unit.

6. A device comprising:
a counter unit configured to generate a count value;
a delay line configured to delay a first clock signal based on the count value to generate a second clock signal;
an inversion control unit configured to select one of a non-inverted signal of the second clock signal and an inverted signal of the second clock signal to output a third clock signal;
a replica output unit configured to generate a fourth clock signal based on the third clock signal;
a phase comparison unit configured to compare phases of the first and fourth clock signals to generate a phase determination signal; and
a control unit configured to generate a reset signal, an inversion control signal, a code update signal, and a counter update signal, wherein
the count value of the counter unit is initialized to a first initial value and the inversion control unit selects the non-inverted signal when the reset signal is activated,
the inversion control unit is configured to select one of the non-inverted signal and the inverted signal based on a logic level of the phase determination signal when the inversion control signal is activated,
the count value of the counter unit is updated from the first initial value to a second initial value when the code update signal is activated after the inversion control signal is activated, and
the count value of the counter unit is counted up or counted down from the second initial value based on a logic level of the phase determination signal when the counter update signal is activated.

7. The device as claimed in claim 6, wherein a phase difference between the second clock signal in which the count value indicates the first initial value and the second clock signal in which the count value indicates the second initial value is larger than an amount of phase shift of the second clock signal when the counter update signal is activated.

8. The device as claimed in claim 6, wherein a phase difference between the second clock signal in which the count value indicates the first initial value and the second clock signal in which the count value indicates the second initial value is larger than an amount of jitter included in the first clock signal.

9. The device as claimed in claim 6, wherein the first initial value is offset from a central value of the count value.

10. The device as claimed in claim 9, wherein the second initial value is offset from the central value of the count value, and an amount of offset of the second count value is smaller than an amount of offset of the first count value.

11. The device as claimed in claim 6, wherein the second initial value is variable based on a setting signal.

12. The device as claimed in claim 11, further comprising a non-volatile storage circuit that stores the setting signal in a non-volatile manner.

13. A method comprising:
delaying a first clock signal to produce a delayed clock signal;
producing an inverted signal of the delayed clock signal;
detecting a relationship in phase between the first clock signal and a second clock signal to produce a detection signal;
selecting one of the delayed signal and the inverted signal in response to the detection signal; and
producing the second clock signal as a replica signal in response to a selected one of the delayed signal and the inverted signal.

14. The method as claimed in claim 13, wherein the selecting is performed such that the delayed clock signal is selected when one of leading and trailing edges of the second clock signal appears during a first logic level of the first clock signal and the inverted signal is selected when the one of leading and trailing edges of the second clock signal appears during a second logic level of the first clock signal.

15. The method as claimed in claim 14, wherein the delaying is performed such that the first clock signal is delayed by an amount related to a count value that is controlled by the detection signal.

16. The method as claimed in claim 14, wherein the detection signal takes a first level when the one of leading and trailing edges of the second clock signal appears during the first logic level of the first clock signal and a second level when the one of leading and trailing edges of the second clock signal appears during the second logic level of the first clock signal.

* * * * *